(12) United States Patent
Kakuno et al.

(10) Patent No.: US 10,290,995 B2
(45) Date of Patent: May 14, 2019

(54) TERAHERTZ QUANTUM CASCADE LASER DEVICE

(71) Applicant: Kabushiki Kaisha Toshiba, Minato-ku (JP)

(72) Inventors: Tsutomu Kakuno, Fujisawa (JP); Shinji Saito, Yokohama (JP); Osamu Yamane, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/693,601

(22) Filed: Sep. 1, 2017

(65) Prior Publication Data

US 2018/0069374 A1 Mar. 8, 2018

(30) Foreign Application Priority Data

Sep. 5, 2016 (JP) .................................. 2016-172792

(51) Int. Cl.
*H01S 5/06* (2006.01)
*H01S 5/02* (2006.01)
(Continued)

(52) U.S. Cl.
CPC .......... *H01S 5/0604* (2013.01); *H01S 5/0206* (2013.01); *H01S 5/02415* (2013.01);
(Continued)

(58) Field of Classification Search
CPC ...... H01S 5/22; H01S 5/06258; H01S 5/1203; H01S 5/3402; H01S 5/06837; H01S 5/1096; H01S 5/02415
See application file for complete search history.

(56) References Cited

U.S. PATENT DOCUMENTS

| 6,438,148 B1 | 8/2002 | Hui et al. | |
| 7,924,897 B2 * | 4/2011 | Ohno | B82Y 20/00 372/43.01 |

(Continued)

FOREIGN PATENT DOCUMENTS

JP 2008-053519 3/2008
WO WO 2015/163965 A2 10/2015

OTHER PUBLICATIONS

Vijayraghavan, "Broadly tunable terahertz generation in mid-infrared quantum cascade lasers," Jun. 2013, Nature communications, pp. 1-7.*

(Continued)

*Primary Examiner* — Michael Carter
(74) *Attorney, Agent, or Firm* — Oblon, McClelland, Maier & Neustadt, L.L.P.

(57) ABSTRACT

A terahertz quantum cascade laser device includes a substrate, q semiconductor stacked body and a first electrode. The semiconductor stacked body includes an active layer and a first clad layer. The active layer is provided on the substrate and is configured to emit infrared laser light by an intersubband optical transition. The first clad layer is provided on the active layer. A ridge waveguide is provided in the semiconductor stacked body. A first distributed feedback region and a second distributed feedback region are provided at an upper surface of the first clad layer to be separated from each other along an extension direction of the ridge waveguide. The first electrode is provided at the upper surface of the first clad layer. A planar size of the first distributed feedback region is smaller than a planar size of the second distributed feedback region.

14 Claims, 6 Drawing Sheets

(51) Int. Cl.
  *H01S 5/024* (2006.01)
  *H01S 5/042* (2006.01)
  *H01S 5/12* (2006.01)
  *H01S 5/22* (2006.01)
  *H01S 5/34* (2006.01)
  *H01S 5/0625* (2006.01)
  *H01S 5/10* (2006.01)
  *H01S 5/343* (2006.01)
  *H01S 5/028* (2006.01)

(52) U.S. Cl.
  CPC ........ *H01S 5/0425* (2013.01); *H01S 5/06258* (2013.01); *H01S 5/1096* (2013.01); *H01S 5/12* (2013.01); *H01S 5/1203* (2013.01); *H01S 5/22* (2013.01); *H01S 5/3402* (2013.01); *H01S 5/028* (2013.01); *H01S 5/0612* (2013.01); *H01S 5/34313* (2013.01)

(56) References Cited

U.S. PATENT DOCUMENTS

| 9,742,151 B1 * | 8/2017 | Botez ........................ H01S 5/12 |
| 2008/0048792 A1 | 2/2008 | Ouchi et al. |
| 2010/0158056 A1 | 6/2010 | Shin et al. |
| 2016/0352072 A1 | 12/2016 | Belkin et al. |

OTHER PUBLICATIONS

Karun Vijayraghavan, et al., "Broadly tunable terahertz generation in mid-infrared quantum cascade lasers", Nature Communications, XP-002777530, vol. 4, 2012, pp. 1-7.

Takayuki Shibuya, et al., "Cherenkov-Type Phase Matched Terahertz Wave Generation Using Difference Frequency Mixing with Lithium Niobate Crystal," May 2009, The Review of Laser Engineering, the Laser Society of Japan, 12 Pages ( with English Translation).

* cited by examiner

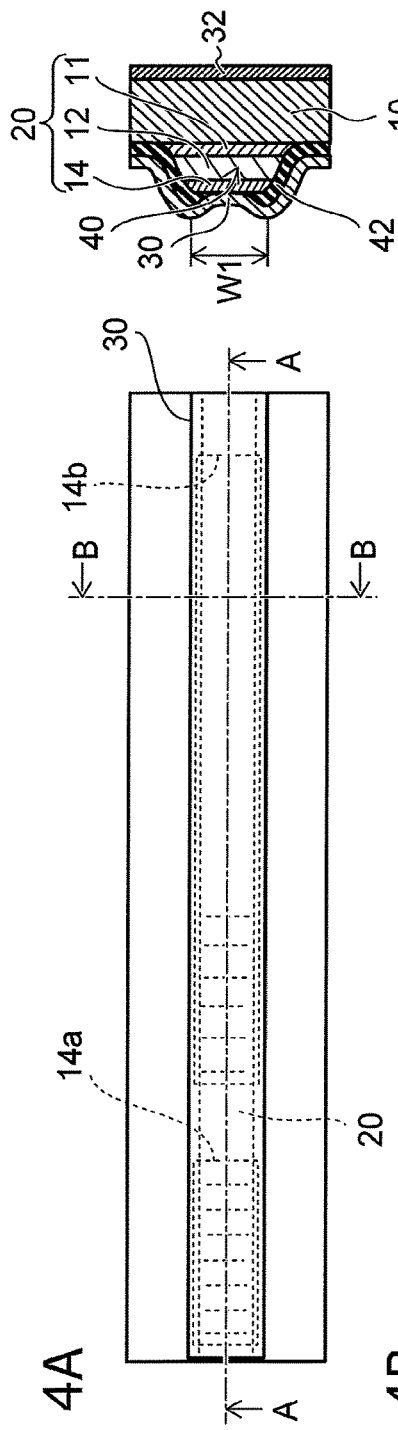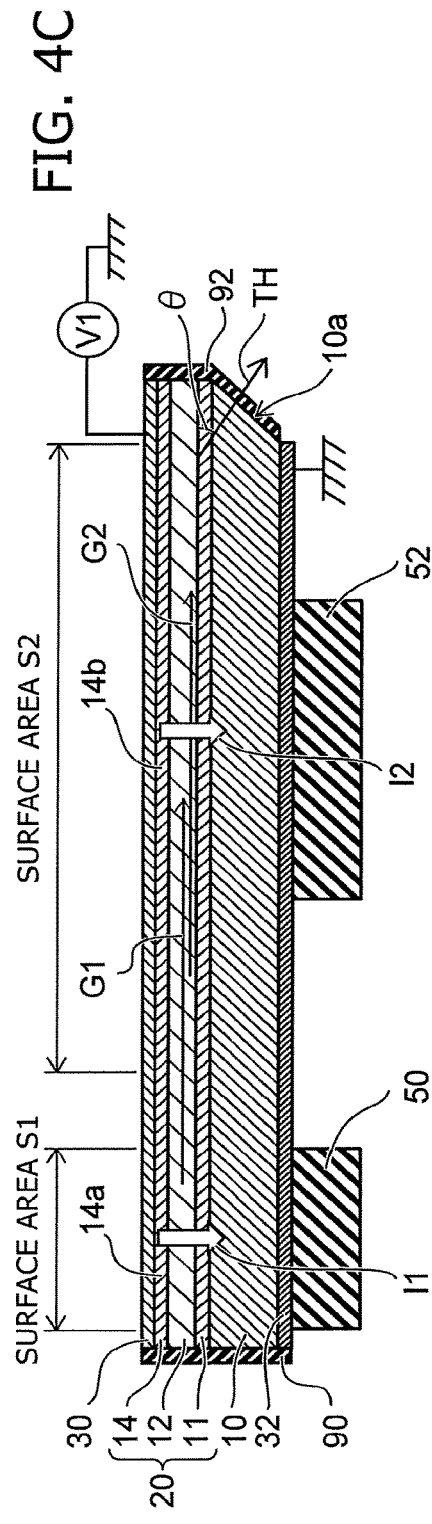
FIG. 4A
FIG. 4B
FIG. 4C

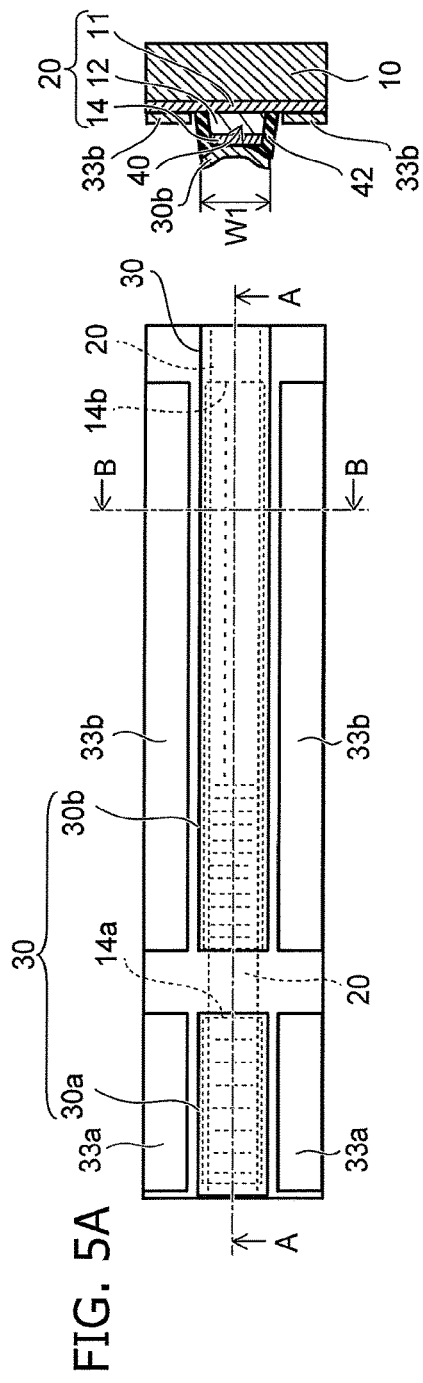
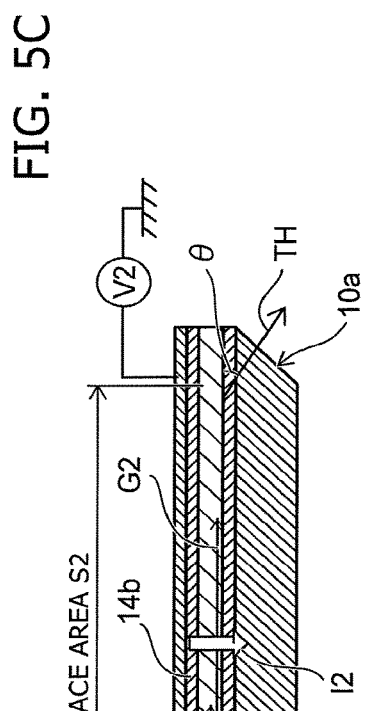
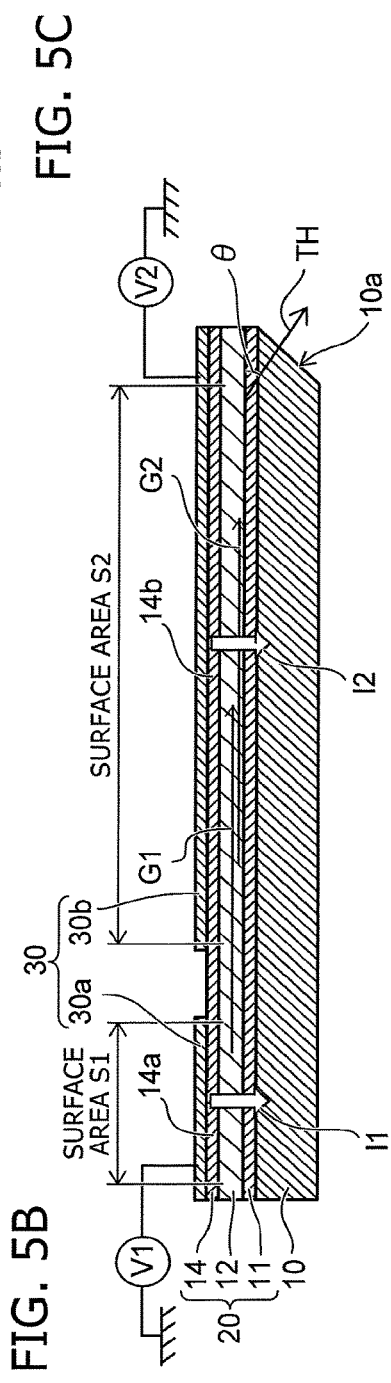

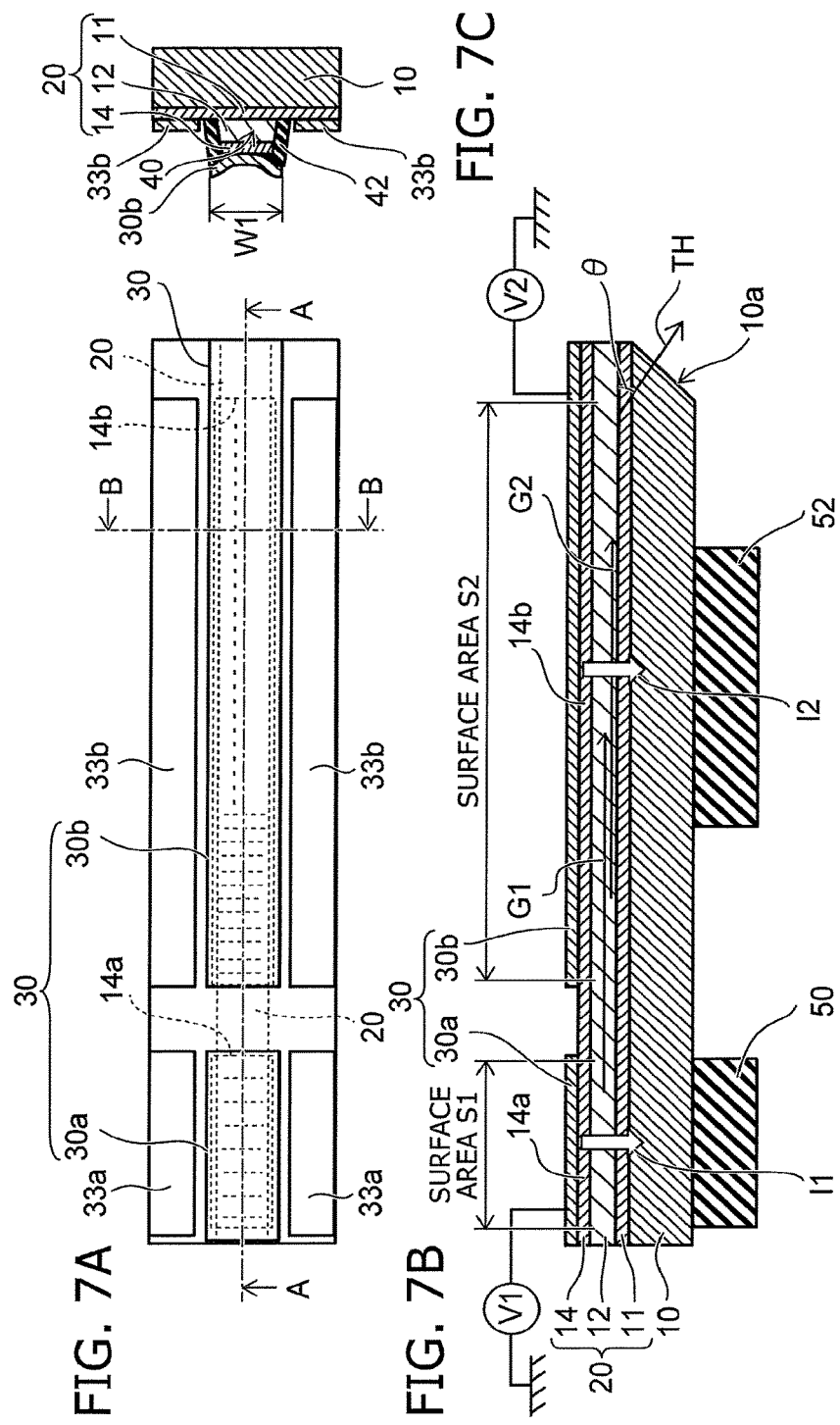

TERAHERTZ QUANTUM CASCADE LASER DEVICE

CROSS-REFERENCE TO RELATED APPLICATIONS

This application is based upon and claims the benefit of priority from Japanese Patent Application No. 2016-172792, filed on Sep. 5, 2016; the entire contents of which are incorporated herein by reference.

FIELD

Embodiments described herein relate generally a terahertz quantum cascade laser device.

BACKGROUND

For example, a designated substance inside a paper bag, etc., can be detected using a terahertz wave of a frequency of 30 GHz to 30 THz.

However, it is difficult to generate a terahertz wave using a high frequency circuit.

A terahertz wave is generated as a difference frequency wave when dual-wavelength infrared laser light is generated from a KTP (KTiOP4)-OPO (Optical Parametric Oscillator) and irradiated on a nonlinear crystal. However, the configuration is complex.

BRIEF DESCRIPTION OF THE DRAWINGS

FIG. 4A is a schematic plan view of a modification of the first embodiment, FIG. 4B is a schematic cross-sectional view along line A-A, and FIG. 4C is a schematic cross-sectional view along line B-B;

FIG. 5A is a schematic plan view of a terahertz quantum cascade laser device according to a second embodiment, FIG. 5B is a schematic cross-sectional view along line A-A, and FIG. 5C is a schematic cross-sectional view along line B-B;

FIG. 7A is a schematic plan view of a modification of the second embodiment, FIG. 7B is a schematic cross-sectional view along line A-A, and FIG. 7C is a schematic cross-sectional view along line B-B.

DETAILED DESCRIPTION

In general, according to one embodiment, a terahertz quantum cascade laser device includes a substrate, q semiconductor stacked body and a first electrode. The semiconductor stacked body includes an active layer and a first clad layer. The active layer is provided on the substrate and is configured to emit infrared laser light by an intersubband optical transition. The first clad layer is provided on the active layer. A ridge waveguide is provided in the semiconductor stacked body. A first distributed feedback region and a second distributed feedback region are provided at an upper surface of the first clad layer to be separated from each other along an extension direction of the ridge waveguide. The first electrode is provided at the upper surface of the first clad layer. A planar size of the first distributed feedback region is smaller than a planar size of the second distributed feedback region.

An embodiment of the invention will now be described with reference to the drawings.

Figure 1:
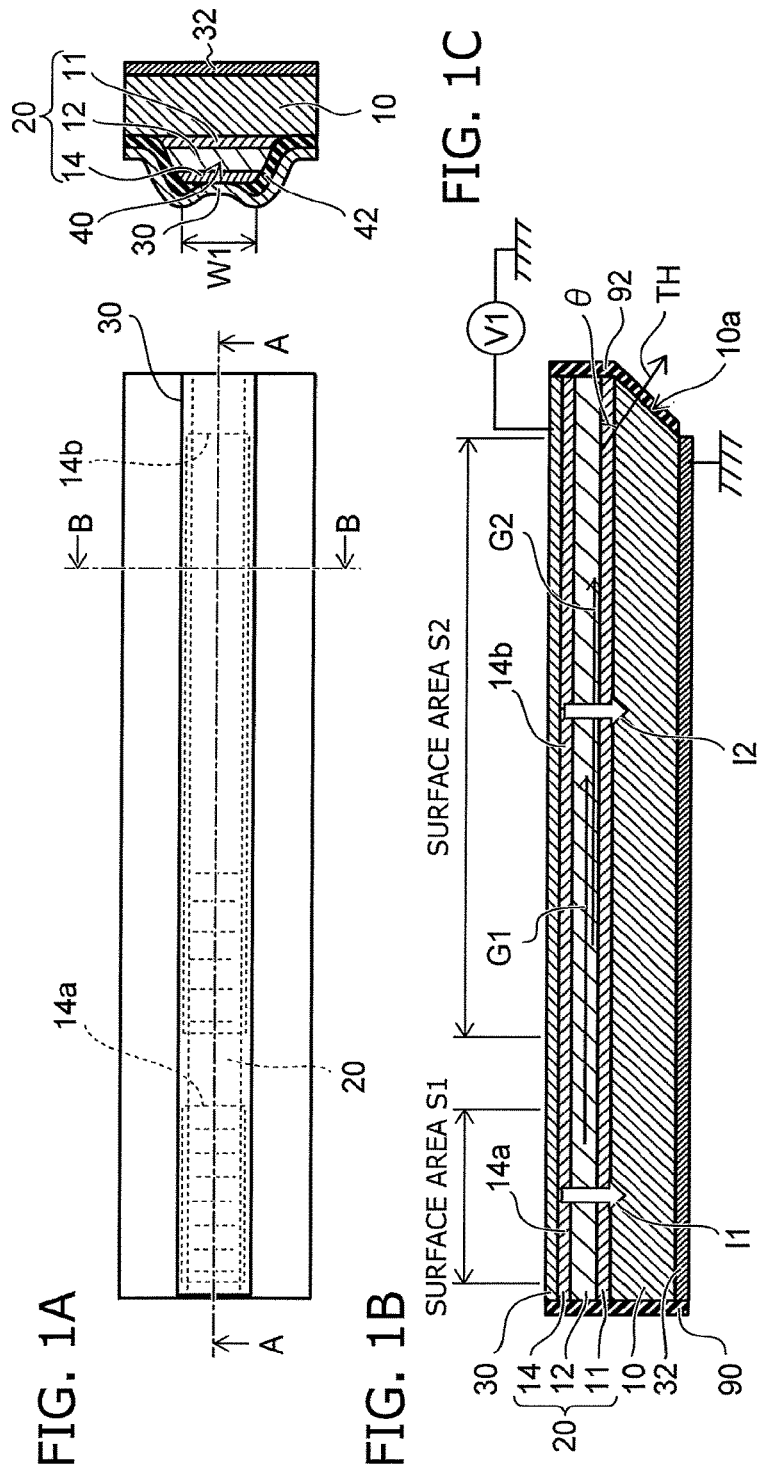
FIG. 1A is a schematic plan view of a terahertz quantum cascade laser device according to a first embodiment.
FIG. 1B is a schematic cross-sectional view along line A-A.
FIG. 1C is a schematic cross-sectional view along line B-B.

FIG. 1A is a schematic plan view of a terahertz quantum cascade laser device according to a first embodiment; FIG. 1B is a schematic cross-sectional view along line A-A; and FIG. 1C is a schematic cross-sectional view along line B-B.

The terahertz quantum cascade laser device includes a substrate 10, a semiconductor stacked body 20, and a first electrode 30.

The substrate 10 is made of InP, InGaAs, GaAs, or the like that has optical nonlinearity.

The semiconductor stacked body 20 includes an active layer 12 and a first clad layer 14. The active layer 12 is provided on the substrate 10 and is configured to emit first infrared laser light G1 and second infrared laser light G2 by an intersubband optical transition. The first clad layer 14 includes a first distributed feedback region 14a and a second distributed feedback region 14b provided to be separated along the extension direction of a ridge waveguide 40 (parallel to line A-A).

The active layer 12 includes, for example, quantum well layers having a cascade connection in which well layers made of $In_xGa_{1-x}As$ (0<x<1) and barrier layers made of $In_yAl_{1-y}As$ (0<y<1) are stacked alternately.

In the first embodiment, a planar size S1 of the first distributed feedback region 14a is smaller than a planar size S2 of the second distributed feedback region 14b. The semiconductor stacked body 20 may further include a second clad layer 11. A highly reflective film 90 that is made of SiN/Au, etc., may be provided at one end surface of the semiconductor stacked body 20. A low reflectance film 92 that is made of $Y_2O_3$, etc., may be provided at the other end surface of the semiconductor stacked body 20 and used as a light-emitting surface. A terahertz wave TH is emitted from an end surface 10a of the substrate 10.

The planar size S1 of the first distributed feedback region 14a is represented by (the width of the upper surface of the first clad layer 14)×(the length along line A-A of the diffraction grating region). The planar size S2 of the second distributed feedback region 14b is represented by (the width of the upper surface of the first clad layer 14)×(the length along line A-A of the diffraction grating region). In the case where the widths of the diffraction gratings are the same, the ratio of the planar sizes is the ratio of the lengths of the diffraction grating regions.

In the upper portion of the semiconductor stacked body 20, at least the first clad layer 14 and the active layer 12 are included; and the ridge waveguide 40 that has a mesa-shaped cross section or a rectangular cross section is provided. A dielectric layer 42 that has a refractive index that is lower than the refractive index of a layer included in the semiconductor stacked body 20 is provided at the two side surfaces of the ridge waveguide 40, confines the first infrared laser light G1 and the second infrared laser light G2 in the horizontal direction, and protects the side surfaces of the active layer 12. The semiconductor stacked body 20 may further include the second clad layer 11 between the active layer 12 and the substrate 10. A ridge width W1 may be set to be, for example, 6 to 20 μm, etc.

The first electrode 30 is provided at the upper surface of the first clad layer 14. The first distributed feedback region 14a and the second distributed feedback region 14b include one-dimensional diffraction gratings disposed in the upper surface of the first clad layer 14. A pitch P of the diffraction grating is represented by Formula (1).

$$P = m_B \times (\lambda 0 / 2 n_r)$$   Formula (1)

Here, $m_B$ is an integer of 1 or more; $\lambda 0$ is the wavelength inside free space; and $n_r$ is the refractive index of the medium included in the ridge waveguide.

In the case where the substrate 10 is conductive, a second electrode 32 may be provided on the back surface of the substrate 10.

Figure 2:
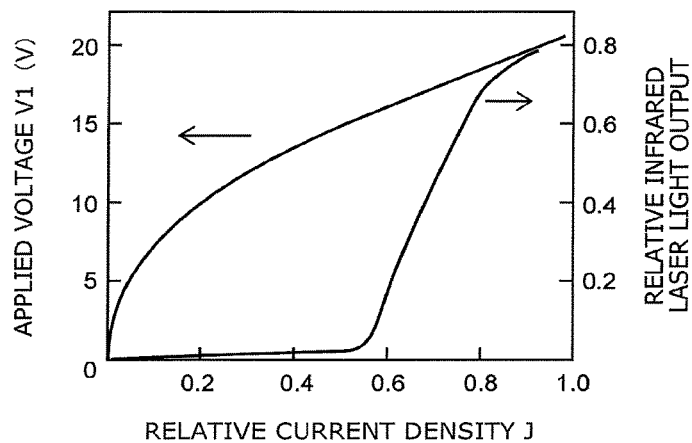
FIG. 2 is a graph describing the applied voltage dependence of the quantum cascade laser device on the relative current density.

FIG. 2 is a graph describing the applied voltage dependence of the quantum cascade laser device on the relative current density.

The diffraction grating is taken to be arranged at a prescribed pitch along the ridge waveguide 40. For example, single-mode infrared laser light starts to be emitted when the relative current density J exceeds 0.5; and the infrared laser light output increases as the applied voltage V1 increases. Because the same voltage V1 is supplied to the first distributed feedback region 14a and the second distributed feedback region 14b, the current density is substantially equal. In the case where the planar sizes of the two distributed feedback regions 14a and 14b are equal, the power consumption in the regions are equal; and the peak temperatures of the regions also are substantially equal. Therefore, the wavelengths of the first infrared laser light G1 and the second infrared laser light G2 are substantially equal; and it is difficult to generate a terahertz wave.

Conversely, in the first embodiment, the ratio (I1/I2) of a current I1 of the first distributed feedback region 14a to a current I2 of the second distributed feedback region 14b is substantially the same as the ratio (S1/S2) of the planar sizes of the two regions; and the electrical power consumed by the second distributed feedback region 14b having the large planar size is large and is about S2/S1 times the electrical power consumed by the first distributed feedback region 14a. The thermal resistance of the first distributed feedback region 14a is taken as $R_{TH1}$; and the thermal resistance of the second distributed feedback region 14b is taken as $R_{TH2}$.

In each region, the generated heat spreads in the vertical direction and the horizontal direction of the semiconductor stacked body 20. In the second distributed feedback region 14b which is the slender region along line A-A, the horizontal-direction component of the generated heat is dissipated mainly in a direction orthogonal to the ridge line A-A. On the other hand, in the first distributed feedback region 14a that has a planar configuration that is closer to a square, the horizontal-direction component of the generated heat is dissipated while spreading from the four sides; therefore, the peripheral length of the heat dissipation source is effectively long. Therefore, $(R_{TH1}/R_{TH2}) < (S2/S1)$; and it is easy for the peak temperature of the second distributed feedback region 14b having the large planar size to be higher than the peak temperature of the first distributed feedback region 14a.

In other words, when the current densities are substantially the same, it is easy for the peak temperature of the second distributed feedback region 14b which has the high current to be higher than the peak temperature of the first distributed feedback region 14a which has the low current. As a result, a wavelength $\lambda 2$ of the second distributed feedback region 14b can be longer than a wavelength $\lambda 1$ of the first distributed feedback region 14a.

The peak temperature of the first distributed feedback region 14a may be set to be higher than the peak temperature of the second distributed feedback region 14b. For example, the horizontal-direction component of the generated heat can be dissipated more effectively by providing a buried layer made of undoped InP, etc., at the two sides of the ridge waveguide 40 in the second distributed feedback region 14b. Therefore, the thermal resistance of the second distributed feedback region 14b can be reduced so that $(S1/S2) \times R_{TH1} > R_{TH2}$; and the wavelength $\lambda 2$ can be lower than the wavelength $\lambda 1$. The wavelength change amount of the infrared laser light per temperature is, for example, 0.25 to 1 nm/° C.

Figures 3A, 3B:
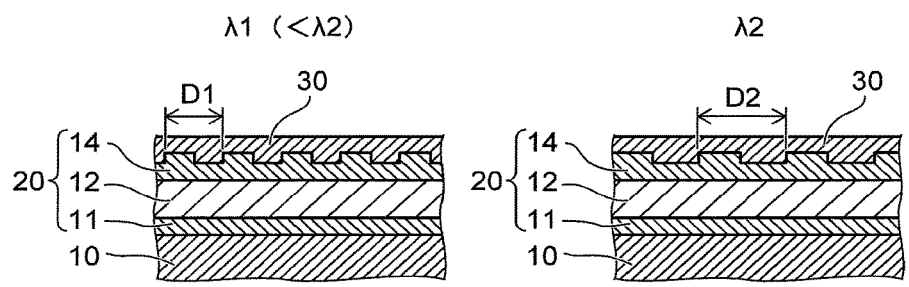
FIG. 3A is a schematic cross-sectional view in which an example of the first distributed feedback region of the terahertz quantum cascade laser device is partially enlarged.
FIG. 3B is a schematic cross-sectional view in which an example of the second distributed feedback region is partially enlarged.

FIG. 3A is a schematic cross-sectional view in which an example of the first distributed feedback region of the terahertz quantum cascade laser device is partially enlarged; and FIG. 3B is a schematic cross-sectional view in which an example of the second distributed feedback region is partially enlarged.

The first infrared laser light G1 is generated in the region of the active layer 12 directly under the first distributed feedback region 14a. The second infrared laser light G2 is generated in the region of the active layer 12 directly under the second distributed feedback region 14b. The pitch of the diffraction grating of the first distributed feedback region 14a is taken as D1; and the pitch of the diffraction grating of the second distributed feedback region 14b is taken as D2. The wavelength $\lambda 1$ of the first infrared laser light G1 generated in the first distributed feedback region 14a can be changed using the pitch D1. The wavelength $\lambda 2$ of the second infrared laser light G2 generated in the second distributed feedback region 14b can be changed using the pitch D2.

As in the drawing, in the case where pitch D1≤pitch D2, to cause the terahertz wave as the difference frequency wave to be within a prescribed range, the changeable temperature range can be set to be narrow; and the control precision of the temperature can be increased.

FIG. 4A is a schematic plan view of a modification of the first embodiment; FIG. 4B is a schematic cross-sectional view along line A-A; and FIG. 4C is a schematic cross-sectional view along line B-B.

The terahertz quantum cascade laser device may further include a first Peltier device 50 configured to control the peak temperature of the first distributed feedback region 14a, and a second Peltier device 52 configured to control the peak temperature of the second distributed feedback region 14b.

The chip size of the quantum cascade laser device may be, for example, 10 mm×30 mm, etc. Therefore, the Peltier devices 50 and 52 may be provided respectively in the first distributed feedback region 14a and the second distributed feedback region 14b. For example, it is possible to perform tuning of the wavelength of the terahertz wave by finely adjusting the temperature of one of the two Peltier devices. In such a case, for example, the tuning is easy by superimposing a temporally changing triangle wave on the drive current of the Peltier device. Also, by setting the operation temperatures of the distributed feedback regions to decrease by, for example, several tens of ° C. by using the two Peltier devices, the outputs of the two infrared laser lights can be increased; and the terahertz wave output can be increased.

The emission of the terahertz wave as the difference frequency wave of the two infrared laser lights will now be described. A polarization P that is induced inside the active layer 12 can be represented by Formula (2) using an electric field E of the incident light.

$$P=\chi_1 E+\chi_2 E^2+\chi_3 E^3+\ldots \quad \text{Formula (2)}$$

Here, $\chi_1$, $\chi_2$, $\chi_3$, . . . are the electric susceptibility (the susceptibility).

When the intensity of the first infrared laser light G1 and the intensity of the second infrared laser light G2 become large, the second order and higher order terms of the electric field E become large; and a nonlinear optical effect occurs. For example, the wavelength of the single-mode first infrared laser light G1 is taken to be 4.3 µm (a frequency of 69.7192 THz and a wave number of 2326 cm$^{-1}$); and the wavelength of the single-mode second infrared laser light G2 is taken to be 4.4 µm (a frequency of 68.1346 THz and a wave number of 2273 cm$^{-1}$). The active layer 12 includes InGaAs (the well layer)/InAlAs (the barrier layer), etc. For example, terahertz laser light TH of 15.8453 THz (having a wavelength of 189.2 µm) which is a difference frequency wave is generated by the nonlinear optical effect. The terahertz laser light TH which is the difference frequency wave is emitted from the end surface 10a of the substrate 10.

FIG. 5A is a schematic plan view of a terahertz quantum cascade laser device according to a second embodiment; FIG. 5B is a schematic cross-sectional view along line A-A; and FIG. 5C is a schematic cross-sectional view along line B-B.

In the second embodiment, the first electrode 30 is subdivided, includes a first region 30a provided on the first distributed feedback region 14a, and includes a second region 30b provided on the second distributed feedback region 14b. The voltage V1 of the first region 30a and a voltage V2 of the second region 30b may have different values.

By setting voltage V1>voltage V2, the current density of the first distributed feedback region 14a can be set to be higher than the current density of the second distributed feedback region 14b. Because the planar size S1 of the first distributed feedback region 14a is smaller than the planar size S2 of the second distributed feedback region 14b, the peak temperature can be increased further by the increase of the current density; and the wavelength change range can be widened further.

The substrate 10 may be semi-insulative. In such a case, the second clad layer 11 is exposed at the two side surfaces of the ridge waveguide 40. Second electrodes 33a and 33b may be provided at the front surface of a high-concentration layer included in the second clad layer 11.

Figures 6A, 6B:
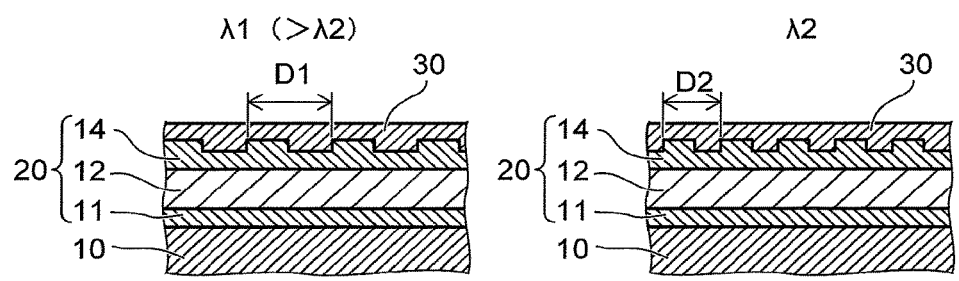
FIG. 6A is a schematic cross-sectional view in which an example of the first distributed feedback region of the terahertz quantum cascade laser device according to the second embodiment is partially enlarged.
FIG. 6B is a schematic cross-sectional view in which an example of the second distributed feedback region of the terahertz quantum cascade laser device according to the second embodiment is partially enlarged.

FIG. 6A is a schematic cross-sectional view in which an example of the first distributed feedback region of the terahertz quantum cascade laser device according to the second embodiment is partially enlarged; and FIG. 6B is a schematic cross-sectional view in which an example of the second distributed feedback region of the terahertz quantum cascade laser device according to the second embodiment is partially enlarged.

By setting pitch D1≥pitch D2, the wavelength λ1 of the first infrared laser light G1 can be longer than the wavelength λ2 of the second infrared laser light G2. For example, by further setting applied voltage V1>applied voltage V2, the current density of the first distributed feedback region 14a is increased further; and the temperature difference between the first distributed feedback region 14a and the second distributed feedback region 14b becomes large.

Therefore, the frequency difference between the first infrared laser light G1 and the second infrared laser light G2 can be increased further; and the wavelength range of the terahertz wave which is the difference frequency wave can be widened. Or, the pitches may be such that pitch D1<pitch D2.

Thus, in the second embodiment, the temperature difference of the two regions can be controlled by changing the supply voltages V1 and V2 independently. It is easy to perform tuning of the terahertz wave when at least one of the supply voltage V1 or V2 includes a temporally changing triangle wave.

FIG. 7A is a schematic plan view of a modification of the second embodiment; FIG. 7B is a schematic cross-sectional view along line A-A; and FIG. 7C is a schematic cross-sectional view along line B-B.

The terahertz quantum cascade laser device further includes the first Peltier device 50 configured to control the peak temperature of the first distributed feedback region 14a, and the second Peltier device 52 configured to control the peak temperature of the second distributed feedback region 14b.

For example, by reducing the operation temperature several tens of ° C. by using the Peltier devices, the infrared laser output increases; and the terahertz wave output increases. Also, it is easy to perform tuning of the wavelengths.

In the first and second embodiments and the modifications of the first and second embodiments, the active layer 12 includes, for example, about several ten to several hundred layers of pairs of light-emitting quantum well layers and injection/relaxation quantum well layers stacked in the thickness direction. Electrons repeat intersubband transitions due to the electric field applied in the vertical direction of the active layer 12; and a gain region is generated inside the active layer 12. By causing the gain region to resonate by an optical resonator, infrared laser light in the wavelength range of 1 to 20 µm or the like is extracted to the outside.

In the case where the terahertz frequency band is set to 1 to 5 THz or the like, it is necessary for the wavelength difference of the two infrared laser lights to be 100 nm or the like. Because there is no jump to the longer wavelength side of the longitudinal mode in the distributed feedback regions, the ratio of the wavelength change to the temperature change is determined by the temperature dependence of the refractive indexes. For example, in the wavelength range of 4 to 4.5 µm, the ratio of the wavelength change is 0.25 to 1 nm/° C. or the like.

To perform tuning of the wavelength of the terahertz wave to the absorption line of the detection object, it is necessary to finely adjust the wavelength of the infrared laser light. For example, the wavelengths of the infrared laser light in the two regions can be finely adjusted using a current change of each region (a temporally changing current triangular waveform, etc.), a temperature difference between the two regions due to the Peltier devices, etc.

A method for extracting the terahertz wave using Cherenkov radiation will now be described.

The first and second infrared laser light G1 and G2 travel straight along the ridge waveguide 40. On the other hand, the terahertz wave is emitted from the end surface 10a of the substrate 10 at a Cherenkov radiation angle θ represented by Formula (3) with respect to the front surface of the active layer 12.

$$\cos\theta = \frac{\lambda_{THz} \cdot n_{THz}}{\lambda_1 \lambda_2 / (n_1 \lambda_2 - n_2 \lambda_1)} \cong \frac{n_{opt}}{n_{THz}} \qquad \text{Formula (3)}$$

Here, $n_{THz}$ is the refractive index of undoped InP for the terahertz wave; $n_{opt}$ is the refractive index of the active layer for infrared; $n_1$ is the effective refractive index of the first infrared laser light $\approx n_{opt}$; $n_2$ is the effective refractive index of the second infrared laser light $\approx n_{opt}$; $\lambda_1$ is the wavelength of the first infrared laser light; and $\lambda_2$ is the wavelength of the second infrared laser light.

For example, the Cherenkov radiation angle θ is about 20° in the case where the wavelength is 3 to 5 µm, $n_{THz}$=3.6, and $n_{opt}$=3.4; and the terahertz wave TH is emitted in the perpendicular direction of the polished end surface 10a of the substrate 10. For a Cherenkov radiation angle θ of about 30°, the terahertz wave TH is refracted at the end surface 10a of the substrate 10 and is emitted parallel to a direction orthogonal to the end surface of the active layer 12 where the infrared laser light is emitted.

According to the first and second embodiments and the modifications of the first and second embodiments, a quantum cascade laser device is provided in which a terahertz wave can be emitted as a difference frequency wave of two infrared rays. By using the quantum cascade laser device, a harmful designated substance inside a paper bag, etc., can be detected. A generator of a terahertz wave is complex unless a quantum cascade laser device is used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A terahertz quantum cascade laser device, comprising:
a substrate;
a semiconductor stacked body including an active layer and a first clad layer, the active layer being provided on the substrate and being configured to emit infrared laser light by an intersubband optical transition, the first clad layer being provided on the active layer, a ridge waveguide being provided in the semiconductor stacked body, a first distributed feedback region and a second distributed feedback region being provided at an upper surface of the first clad layer to be separated from each other along an extension direction of the ridge waveguide;
a first electrode provided at the upper surface of the first clad layer;
a first Peltier device configured to control a peak temperature of the first distributed feedback region; and
a second Peltier device configured to control a peak temperature of the second distributed feedback region,
a size of the first electrode at the first distributed feedback region being smaller than a size of the first electrode at the second distributed feedback region.

2. The device according to claim 1, wherein
first infrared laser light generated in the first distributed feedback region and second infrared laser light generated in the second distributed feedback region are emitted from one end surface of the ridge waveguide, and
terahertz laser light is emitted from an end surface of the substrate tilted with respect to the one end surface of the ridge waveguide, the terahertz laser light being a difference frequency wave of the first infrared laser light and the second infrared laser light.

3. The device according to claim 2, wherein
the first infrared laser light and the second infrared laser light are emitted in the perpendicular direction of the one end surface of the ridge waveguide, and
the terahertz laser light is emitted parallel to the perpendicular direction of the one end surface of the ridge waveguide.

4. The device according to claim 3, wherein a pitch of a diffraction grating of the first distributed feedback region is not more than a pitch of a diffraction grating of the second distributed feedback region.

5. The device according to claim 3, wherein the first electrode includes a first region provided at an upper surface of the first distributed feedback region, and a second region provided at an upper surface of the second distributed feedback region and separated from the first region.

6. The device according to claim 5, wherein a pitch of a diffraction grating of the first distributed feedback region is not less than a pitch of a diffraction grating of the second distributed feedback region.

7. The device according to claim 2, wherein a pitch of a diffraction grating of the first distributed feedback region is not more than a pitch of a diffraction grating of the second distributed feedback region.

8. The device according to claim 2, wherein the first electrode includes a first region provided at an upper surface of the first distributed feedback region, and a second region provided at an upper surface of the second distributed feedback region and separated from the first region.

9. The device according to claim 8, wherein a pitch of a diffraction grating of the first distributed feedback region is not less than a pitch of a diffraction grating of the second distributed feedback region.

10. The device according to claim 1, wherein a pitch of a diffraction grating of the first distributed feedback region is not more than a pitch of a diffraction grating of the second distributed feedback region.

11. The device according to claim 1, wherein the first electrode includes a first region provided at an upper surface of the first distributed feedback region, and a second region provided at an upper surface of the second distributed feedback region and separated from the first region.

12. The device according to claim 11, wherein a pitch of a diffraction grating of the first distributed feedback region is not less than a pitch of a diffraction grating of the second distributed feedback region.

13. The device according to claim 1, wherein a width of the first distributed feedback region and a width of the second distributed feedback region are the same.

14. The device according to claim 1, wherein the active layer includes a quantum well layer made of GaInAs and AlInAs.

* * * * *